(12) United States Patent
Joshi et al.

(10) Patent No.: US 11,199,621 B2
(45) Date of Patent: Dec. 14, 2021

(54) CLOCK-STOP FREQUENCY ADJUSTMENT FOR A TRANSPONDER

(71) Applicant: NXP B.V., Eindhoven (NL)

(72) Inventors: Shankar Joshi, Bangalore (IN); Raghavendra Kongari, Bangalore (IN); Björn Rasmussen, Graz (AT)

(73) Assignee: NXP B.V., Eindhoven (NL)

( * ) Notice: Subject to any disclaimer, the term of this patent is extended or adjusted under 35 U.S.C. 154(b) by 369 days.

(21) Appl. No.: 16/278,006

(22) Filed: Feb. 15, 2019

(65) Prior Publication Data
US 2019/0250267 A1    Aug. 15, 2019

(30) Foreign Application Priority Data

Feb. 15, 2018 (EP) .................................... 18156949

(51) Int. Cl.
| | | |
|---|---|---|
| *G01S 13/76* | (2006.01) | |
| *G06K 19/07* | (2006.01) | |
| *H03L 7/06* | (2006.01) | |
| *G06F 1/10* | (2006.01) | |
| *H03K 7/08* | (2006.01) | |
| *G06K 7/00* | (2006.01) | |

(52) U.S. Cl.
CPC .............. *G01S 13/767* (2013.01); *G06F 1/10* (2013.01); *G06K 7/0008* (2013.01); *G06K 19/0723* (2013.01); *H03K 7/08* (2013.01); *H03L 7/06* (2013.01)

(58) Field of Classification Search
CPC .......... H03K 7/08; H03L 7/06; G06K 7/0008; G06K 19/0723; G06K 19/07336; G06F 1/10; G01S 13/767

USPC ....................... 340/10.1, 13.26, 12.16, 12.11
See application file for complete search history.

(56) References Cited

U.S. PATENT DOCUMENTS

| | | |
|---|---|---|
| 5,504,485 A | 4/1996 | Landt et al. |
| 8,193,912 B1 | 6/2012 | Gutnik et al. |
| 9,165,170 B1 | 10/2015 | Gutnik et al. |

(Continued)

FOREIGN PATENT DOCUMENTS

| | | |
|---|---|---|
| EP | 1413 979 A1 | 4/2004 |
| EP | 2 763 076 A1 | 8/2014 |

OTHER PUBLICATIONS

Extended European Search Report for Patent Appln. No. 18156949.2 (dated Aug. 8, 2018).

*Primary Examiner* — Arnold M Kinkead (57) ABSTRACT

In accordance with a first aspect of the present disclosure, a transponder is provided, comprising: a frequency detector configured to monitor an output frequency of a clock-stop sensor of said transponder, wherein said frequency detector is further configured to determine if said output frequency falls within a response detection frequency range of an external reader, and a frequency shifter configured to shift, in response to the frequency detector determining that the output frequency falls within said response detection frequency range, said output frequency to a value outside said response detection frequency range. In accordance with a second aspect of the present disclosure, a corresponding method of operating a transponder is conceived. In accordance with a third aspect of the present disclosure, a corresponding computer program is provided.

14 Claims, 8 Drawing Sheets

(56) References Cited

U.S. PATENT DOCUMENTS

2006/0022804 A1* 2/2006 Akiyama .......... G06K 19/0723
340/10.51
2016/0078337 A1 3/2016 Cho et al.

* cited by examiner

CLOCK-STOP FREQUENCY ADJUSTMENT FOR A TRANSPONDER

CROSS-REFERENCE TO RELATED APPLICATIONS

This application claims the priority under 35 U.S.C. § 119 of European patent application no. 18156949.2, filed on Feb. 15, 2018, the contents of which are incorporated by reference herein.

OVERVIEW

The present disclosure relates to a transponder. Furthermore, the present disclosure relates to a method of operating a transponder, and to a corresponding computer program. A transponder, such as a radio frequency identification (RFID) transponder, may generate, while it communicates with an external reader, electromagnetic disturbance (EMD) noise due to power consumption variations. This EMD noise may lead to unreliable operation across different readers, because these readers may have different sensitivity to EMD noise. It is noted that EMD is an acronym used in the standard ISO/IEC 14443.

SUMMARY

In accordance with a first aspect of the present disclosure, a transponder is provided, comprising: a frequency detector configured to monitor an output frequency of a clock-stop sensor of said transponder, wherein said frequency detector is further configured to determine if said output frequency falls within a response detection frequency range of an external reader, and a frequency shifter configured to shift, in response to the frequency detector determining that the output frequency falls within said response detection frequency range, said output frequency to a value outside said response detection frequency range.

In an embodiment, the frequency detector is further configured to monitor the duty cycle of the clock-stop sensor output, wherein the frequency detector is further configured to determine if said duty cycle falls within a response duty cycle range; and the frequency shifter is further configured to shift said duty cycle in response to the frequency detector determining that the duty cycle falls within said response duty cycle range.

In an embodiment, the response detection frequency range and/or the response duty cycle range are programmable parameters.

In an embodiment, the transponder further comprises a memory for storing said programmable parameters.

In an embodiment, said memory is a non-volatile memory.

In an embodiment, the frequency detector and the frequency shifter are configured to use different sets of programmable parameters for different sets of reader commands.

In an embodiment, the transponder is a radio frequency identification (RFID) transponder.

In an embodiment, the transponder is an RFID tag or an RFID card.

In accordance with a second aspect of the present disclosure, a method of operating a transponder is conceived, the method comprising: monitoring, by a frequency detector of said transponder, an output frequency of a clock-stop sensor of said transponder; determining, by said frequency detector, if said output frequency falls within a response detection frequency range of an external reader, and shifting, by a frequency shifter of said transponder, in response to the frequency detector determining that the output frequency falls within said response detection frequency range, said output frequency to a value outside said response detection frequency range.

In an embodiment, the frequency detector further monitors the duty cycle of the clock-stop sensor output; the frequency detector further determines if said duty cycle falls within a response duty cycle range; and the frequency shifter further shifts said duty cycle in response to the frequency detector determining that the duty cycle falls within said response duty cycle range.

In an embodiment, the response detection frequency range and/or the response duty cycle range are programmable parameters.

In an embodiment, said programmable parameters are stored in a memory of said transponder.

In an embodiment, the frequency detector and the frequency shifter use different sets of programmable parameters for different sets of reader commands.

In accordance with a third aspect of the present disclosure, a computer program is provided, the program comprising instructions that, when executed by a processing unit, carry out a method of the kind set forth.

In an embodiment, a non-transitory computer-readable medium comprises a computer program of the kind set forth.

DESCRIPTION OF DRAWINGS

Embodiments will be described in more detail with reference to the appended drawings, in which.

DESCRIPTION OF EMBODIMENTS

Nowadays, RFID transponders are widely used, in different areas of industry and commerce and for various purposes. RFID transponders may for example be embodied as so-called RFID tags or RFID cards. It is noted that, in the present disclosure, near field communication (NFC) transponders are regarded as a specific type of RFID transponders. Thus, the principles described herein may also be applied to NFC transponders. As mentioned above, an RFID transponder may generate, while it communicates with an external RFID reader, EMD noise due to power consumption variations. This EMD noise may lead to unreliable operation across different readers, because these readers may have a different sensitivity to EMD noise. More specifically, an RFID transponder may, while processing a command, generate EMD noise due to variations in its power consumption. This EMD noise frequency from the RFID transponder may fall in the range of an external reader's response detection frequency, which may result in invalid response detections by the reader. In other words, it is important that an RFID reader does not interpret the EMD noise as a response to a command previously sent to the transponder. If the EMD noise has a frequency that is close to the frequency at which responses are transmitted back to the reader, then said EMD noise may be interpreted as a response. It is noted that the frequency at which responses are transmitted back to the reader is referred to as the response detection frequency herein. A reader often accepts a range of response detection frequencies; this range is referred to as the response detection frequency range.

Figure 1:
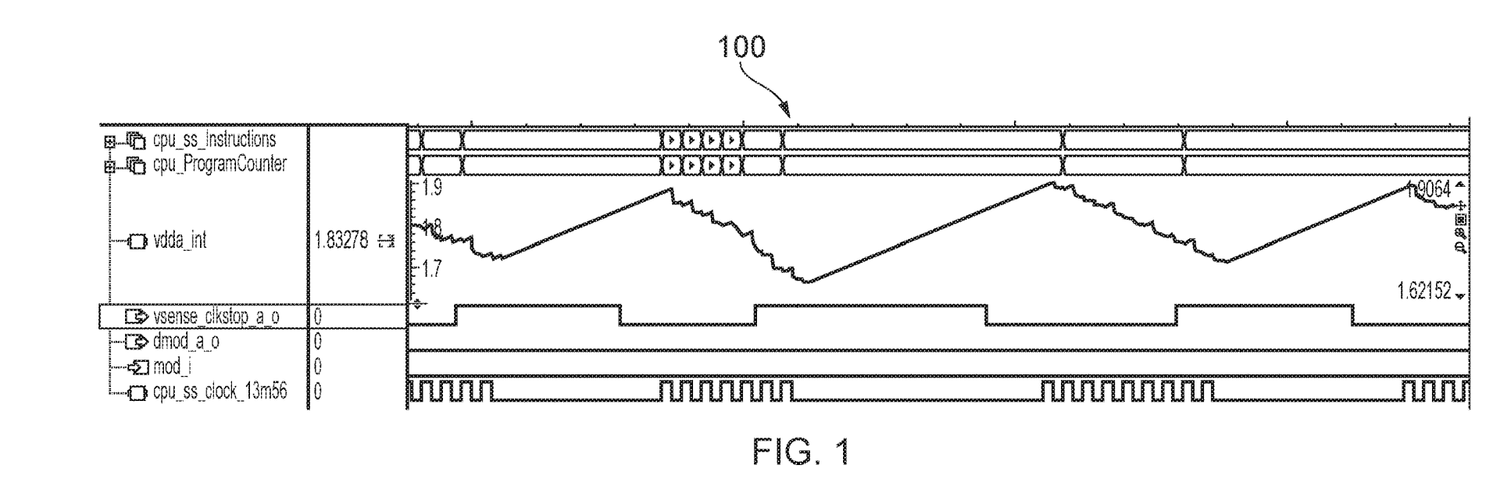
FIG. 1 shows an example of a clock-stop sensor operation.

FIG. 1 shows an example of a clock-stop sensor operation 100. During communication with a reader, once a command is received by the transponder, it should be decoded and processed. Then, the transponder should transmit a response back to the reader. During command processing, there a voltage drop often occurs, which is caused by active digital logic. A voltage-sensor based mechanism can be used to gate clock signals of most of the active digital logic momentarily, in order to reduce the power consumption. Then, clocking can be resumed upon voltage recovery. Thus, the clocks are temporarily stopped to allow the voltage to recover. This is necessary to avoid resets due to low voltages, particularly at lower field strengths. This mechanism is called the clock-stop mechanism. The corresponding component in a transponder is referred to as a clock-stop sensor, because it is configured to sense a voltage drop below a threshold, and to stop one or more clocks in response to sensing said voltage drop. FIG. 1 shows that a clock-stop is triggered (vsense_clkstop_a_o) each time that the voltage drops below 1.8V (vdda_int). The clock signals of the digital logic are gated using vsense_clkstop_a_o. The clock-stop mechanism enables achieving a larger distance of operation between the transponder and the reader (i.e., a lower minimum field strength Hmin). At a certain field strength (based on the clock-stop threshold voltage), however, it may be possible that the clock-stop is triggered repeatedly at a certain frequency. For instance, at a field strength of 0.4 A/m, the clock-stop may trigger at a frequency of approximately 848 KHz, which may also be the reader's response detection frequency. As a result, a voltage swing may become visible as EMD noise from the transponder. This EMD noise may be interpreted by the reader as a response to its command, which results in command failure. It is noted that the frequency at which the clock-stop is triggered is referred to as the output frequency of the clock-stop sensor.

Figure 2A:
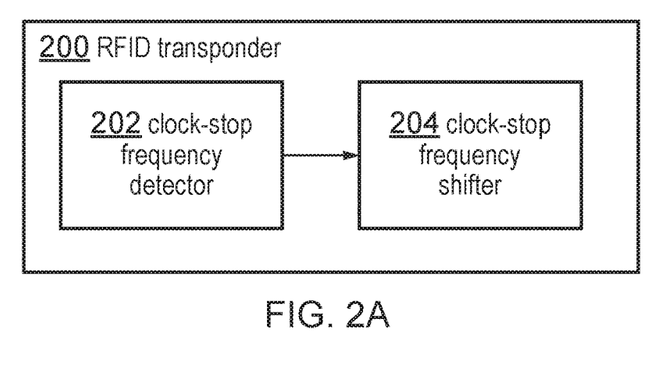
FIG. 2A shows an illustrative embodiment of an RFID transponder.

FIG. 2A shows an illustrative embodiment of an RFID transponder 200. In accordance with the present disclosure, the RFID transponder 200 comprises a frequency detector (202) configured to monitor an output frequency of a clock-stop sensor of said transponder, wherein said frequency detector (202) is further configured to determine if said output frequency falls within a response detection frequency range of an external reader. This frequency detector (202) is referred to as a clock-stop frequency detector. Furthermore, the transponder 200 comprises a frequency shifter (204) configured to shift, in response to the frequency detector (202) determining that the output frequency falls within said response detection frequency range, said output frequency to a value outside said response detection frequency range. This frequency shifter (204) is referred to as a clock-stop frequency shifter. Thus, the frequency shifter (204) effectively shifts the output frequency of the clock-stop sensor to a value outside of the response detection frequency range of the reader. In other words, the frequency shifter (204) effectively changes the frequency at which the clock-stop is triggered to a value outside said response detection frequency range of the reader. Consequently, the effective amplitude is lower due to more regular "artificial" clock stop operation. As a result, the risk that the reader interprets the clock-stop sensor output as a response to a command can be reduced significantly.

In an embodiment, the frequency detector 202 is further configured to monitor the duty cycle of the clock-stop sensor output, and to determine if said duty cycle falls within a response duty cycle range. Furthermore, in this embodiment, the frequency shifter 204 is further configured to shift said duty cycle in response to the frequency detector 202 determining that the duty cycle falls within said response duty cycle range.

Thus, the duty cycle of the clock-stop sensor may be monitored in order to reduce the risk that the clock-stop sensor will not trigger again after a shifted clock-stop. If the shifted duty cycle is not greater than the clock-stop sensor output duty cycle, the analog clock-stop sensor may again trigger and its output frequency might fall in the response detection frequency range of the reader.

Furthermore, in an embodiment, the response detection frequency range and/or the response duty cycle range are programmable parameters. In this way, a post-silicon trimming of parameters can be realized. In a practical and efficient implementation, the transponder comprises a memory for storing the programmable parameters. This memory may be a non-volatile memory, so that the parameters are not lost when the transponder is not powered. Furthermore, in an embodiment, the frequency detector 202 and the frequency shifter 204 are configured to use different sets of parameters for different sets of reader commands. In this way, the transponder can produce reliable response signals for distinct types of commands, e.g. for both L3 and L4 commands in accordance with the standard ISO/IEC 14443.

Figure 2B:
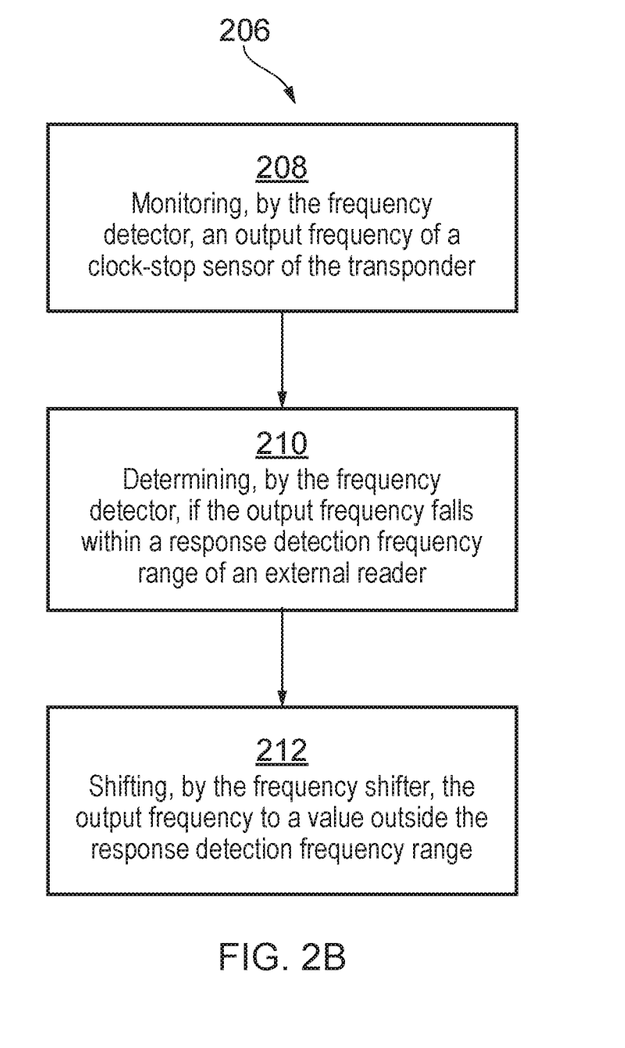
FIG. 2B shows an illustrative embodiment of a method of operating an RFID transponder.

FIG. 2B shows an illustrative embodiment of a method 206 of operating an RFID transponder. The method 206 comprises, at 208, monitoring, by the frequency detector, an output frequency of a clock-stop sensor of the transponder, at 210, determining, by the frequency detector, if the output frequency falls within a response detection frequency range of an external reader, and at 212, shifting, by the frequency shifter, the output frequency to a value outside the response detection frequency range.

Figure 2C:
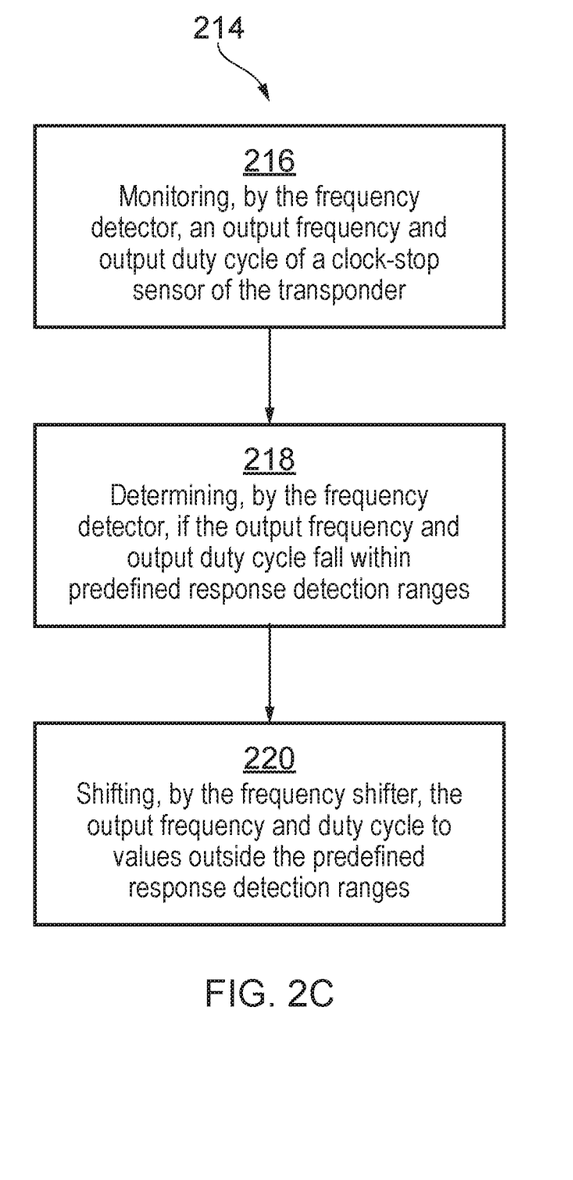
FIG. 2C shows another illustrative embodiment of a method of operating an RFID transponder.

FIG. 2C shows another illustrative embodiment of a method 214 of operating an RFID transponder. The method 214 comprises, at 216, monitoring, by the frequency detector, an output frequency and output duty cycle of a clock-stop sensor of the transponder, at 218, determining, by the frequency detector, if the output frequency and output duty cycle fall within predefined response detection ranges (i.e., a response detection frequency range and a response duty cycle range), and at 220, shifting, by the frequency shifter, the output frequency and duty cycle to values outside the predefined response detection ranges.

The methods 206, 214 can be implemented at least partially as a computer program executed by a processing unit included in the transponder. At least a part of the computer program may be performed by digital logic that performs predefined functions. For instance, the clock-stop sensor output frequency and the clock-stop sensor output duty cycle can be monitored using digital logic.

Figure 3:
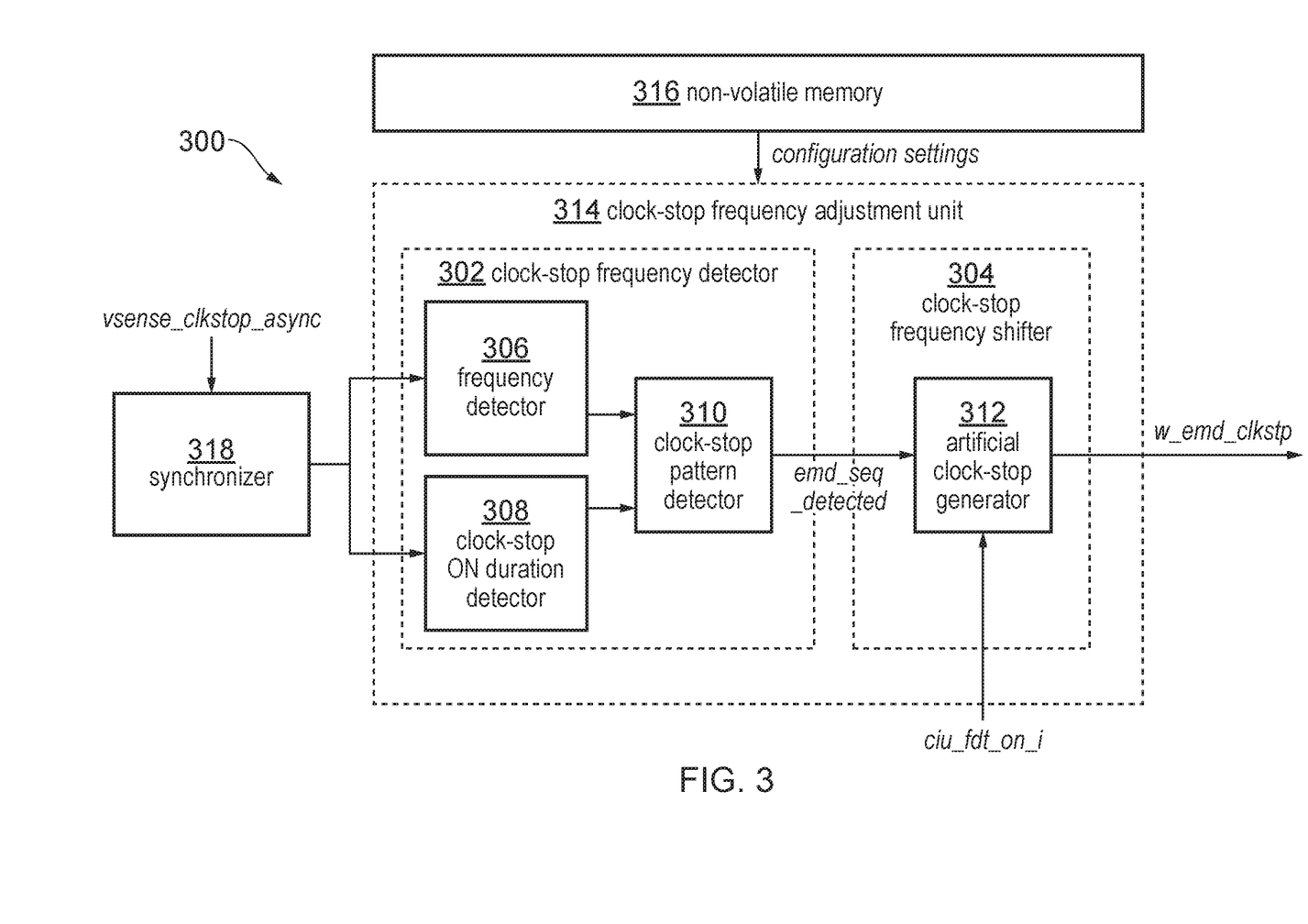
FIG. 3 shows an illustrative embodiment of a clock-stop frequency adjustment system.

FIG. 3 shows an illustrative embodiment of a clock-stop frequency adjustment system 300. More specifically, FIG. 3 shows an example of an implementation of a clock-stop frequency detector 302 of the kind set forth and a clock-stop frequency shifter 304 of the kind set forth. The clock-stop frequency detector 302 and clock-stop frequency shifter 304 form part of clock-stop frequency adjustment unit 314, which is communicatively coupled to a non-volatile memory 316. The clock-stop frequency detector 302 comprises a frequency detector 306, a clock-stop ON duration detector 308 and a clock-stop pattern detector 310. The clock-stop frequency shifter 304 comprises an artificial clock-stop generator, which is a unit that generates an artificial clock-stop frequency and duty cycle. The frequency detector 306 and clock-stop ON duration detector 308 are configured to receive input from a synchronizer 318.

More specifically, the synchronizer 318 is configured to remove glitches and to synchronize the clock-stop sensor output signal, which is an asynchronous signal from the analog domain, to the digital clock domain. The frequency detector 306 is configured to measure the clock-stop sensor output from the analog domain, that is how frequently the clock-stop sensor is being triggered. In other words, it is configured to measure the period of the clock-stop sensor output. The clock-stop ON duration detector 308 is configured to measure the high (logic 1) duration of the clock-stop sensor output. In other words, it is configured to measure the clock-stop sensor output duty cycle. The clock-stop pattern detector 310 is configured to check if the frequency measured by detector 306 falls within the configured frequency range, and to check if the ON duration measured by detector 308 falls within the configured ON duration range. If both frequency and ON duration of the clock-sensor output fall within the configured ranges, it is concluded that a pattern has been detected. If this pattern repeats for the configured number of times, the signal emd_seq_detected is asserted, which indicates that unacceptable EMD noise has been detected. The artificial clock-stop generator 312 is configured to override, once the pattern has been detected, the clock-stop sensor output with a predefined clock-stop with shifted frequency and duty cycle, referred to as an artificial clock-stop (w_emd_clkstp). Thus, the term "artificial" is used to indicate that the shifted clock-stop signal overrides the clock-stop sensor output. The signal ciu_jdt_on_i is a signal that indicates a command processing duration. Unacceptable EMD noise is particularly harmful during the processing of a command. The signal ciu_fdt_on_i should therefore be high from the end of a command reception until the start of a response transmission, so as to activate the artificial clock-stop generation during processing of the command.

As mentioned above, a digital logic may be implemented to monitor the clock-stop sensor output frequency and its duty cycle, in order to identify unacceptable EMD noise. The settings required for detecting the unacceptable EMD noise can be configured via the non-volatile memory 316. In other words, these settings are programmable parameters. The clock-stop pattern detector 310 is configured to detect a predefined clock-stop pattern, i.e. a clock-stop pattern as defined by said programmable parameters. The artificial clock-stop generator 312 is configured to generate an artificial clock-stop at a predefined frequency and duty cycle, i.e. a frequency and duty cycle as defined by said programmable parameters.

Figure 4:
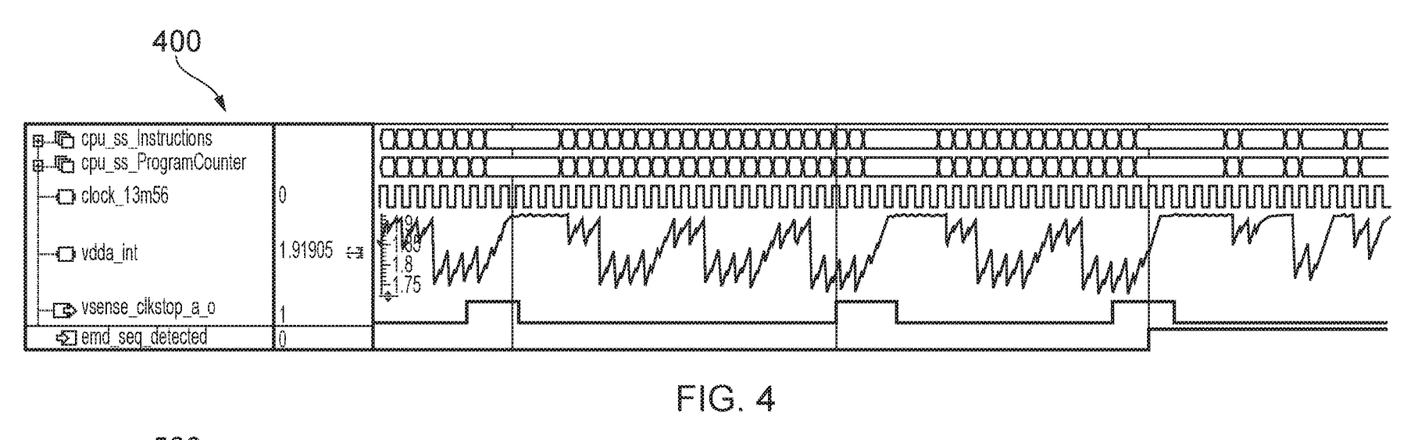
FIG. 4 shows an illustrative embodiment of EMD noise frequency detection.

FIG. 4 shows an illustrative embodiment of EMD noise frequency detection 400. More specifically, FIG. 4 shows a waveform of a mixed signal simulation, which illustrates the EMD noise frequency detection. As mentioned above, EMD noise having a particular frequency and duty cycle may be interpreted by a reader as a response to a command. In order to avoid this, the clock-stop frequency and its duty cycle can be monitored. Furthermore, it can be determined whether said clock-stop frequency and duty cycle fall within a predetermined range. For example, it can be determined if the clock-stop frequency is in the range of 600 kHz to 1 MHz and the clock-stop duty cycle is in the range of 20% to 80%. This range may be treated as reader-detectable EMD noise. FIG. 4 shows that the monitored clock-stop frequency (vsense_clkstop_a_o) is approximately 848 kHz, which falls within the aforementioned range, and is therefore regarded as EMD noise. Thus, the signal emd_seq_detected goes high, indicating that reader-detectable EMD noise is detected. The detection parameters may be programmable via NV memory. As mentioned above, separate sets of parameters can be provided for separate set of commands, e.g. one set for L3 commands and another set for L4 commands in accordance with the standard ISO/IEC 14443. For example, the parameters in the memory can be set such that reader-detectable EMD noise is also detected if the clock-stop frequency is in the range of 700 MHz to 900 MHz and the clock-stop duty cycle is in the range of 20% to 60%.

Figure 5:
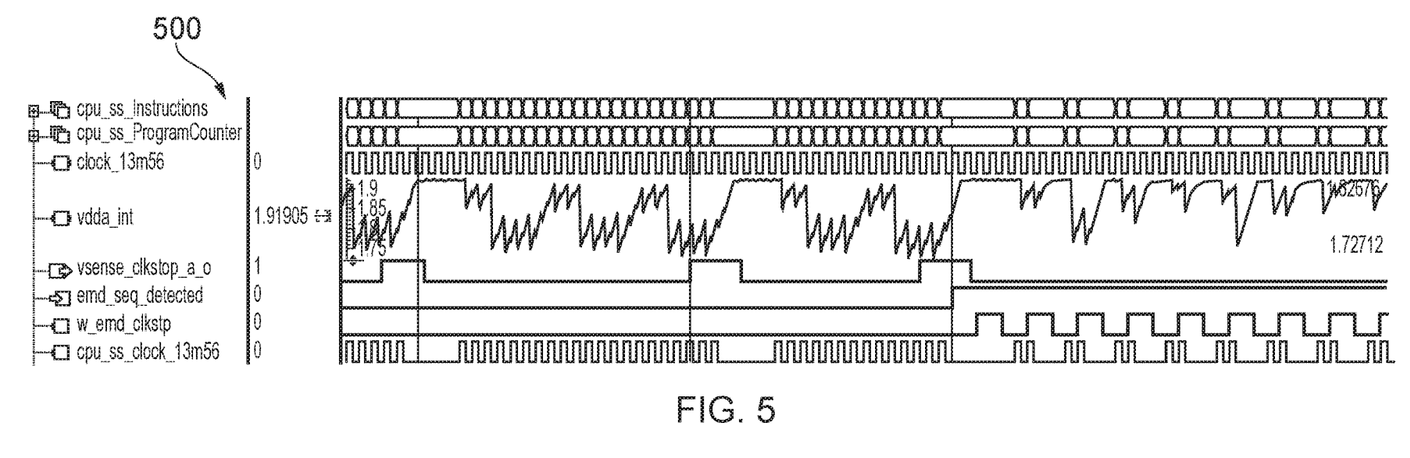
FIG. 5 shows an illustrative embodiment of EMD noise with frequency shift.

FIG. 5 shows an illustrative embodiment of EMD noise with frequency shift 500. More specifically, FIG. 5 shows a waveform of a mixed signal simulation, which illustrates EMD noise with a frequency shift of the kind set forth. As mentioned above, the EMD noise frequency can be shifted outside the response detection frequency range of the reader. For example, an artificial clock-stop may be generated at a frequency of 3.39 MHz. It is shown that an artificial clock-stop signal (w_emd_clkstp) is generated at a frequency of 3.39 MHz after detecting the clock-stop frequency 848 KHz (emd_seq_detected).

Figure 6:
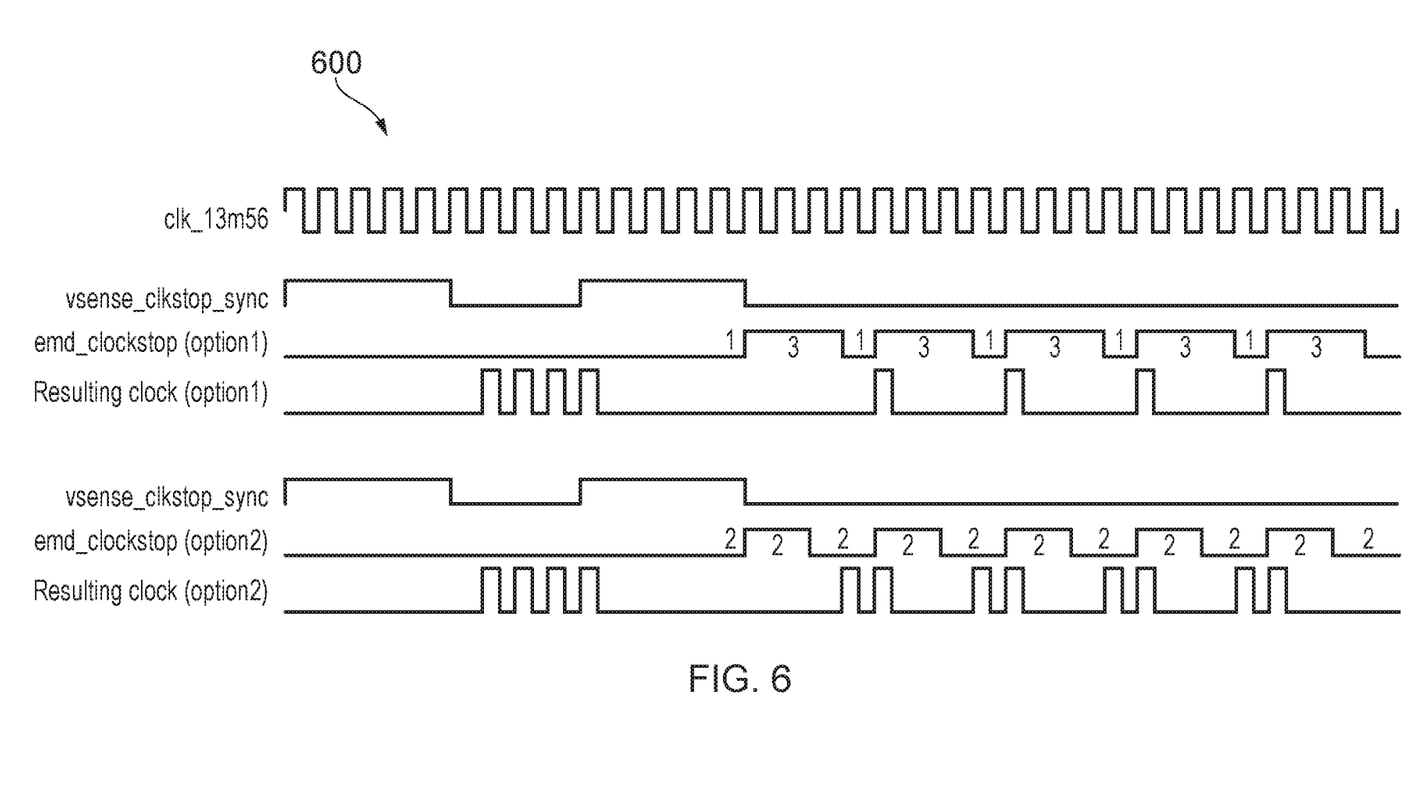
FIG. 6 shows an illustrative embodiment of using different programmable parameters.

FIG. 6 shows an illustrative embodiment of using different programmable parameters 600. As mentioned above, the artificial clock-stop frequency and clock-stop duty cycle can be configured via a non-volatile memory. Separate sets of artificial clock-stop frequency and duty cycle can be chosen for separate sets of commands, e.g. one set for L3 commands and another set for LA commands in accordance with the standard ISO/IEC 14443. For example, the artificial clock-stop duty cycle may be 50% for L3 commands (i.e., a ratio of 2:2, shown as option 2), while the artificial clock-stop duty cycle may be 75% for L4 commands (i.e., a ratio of 3:1, shown as option 1).

Figure 7:
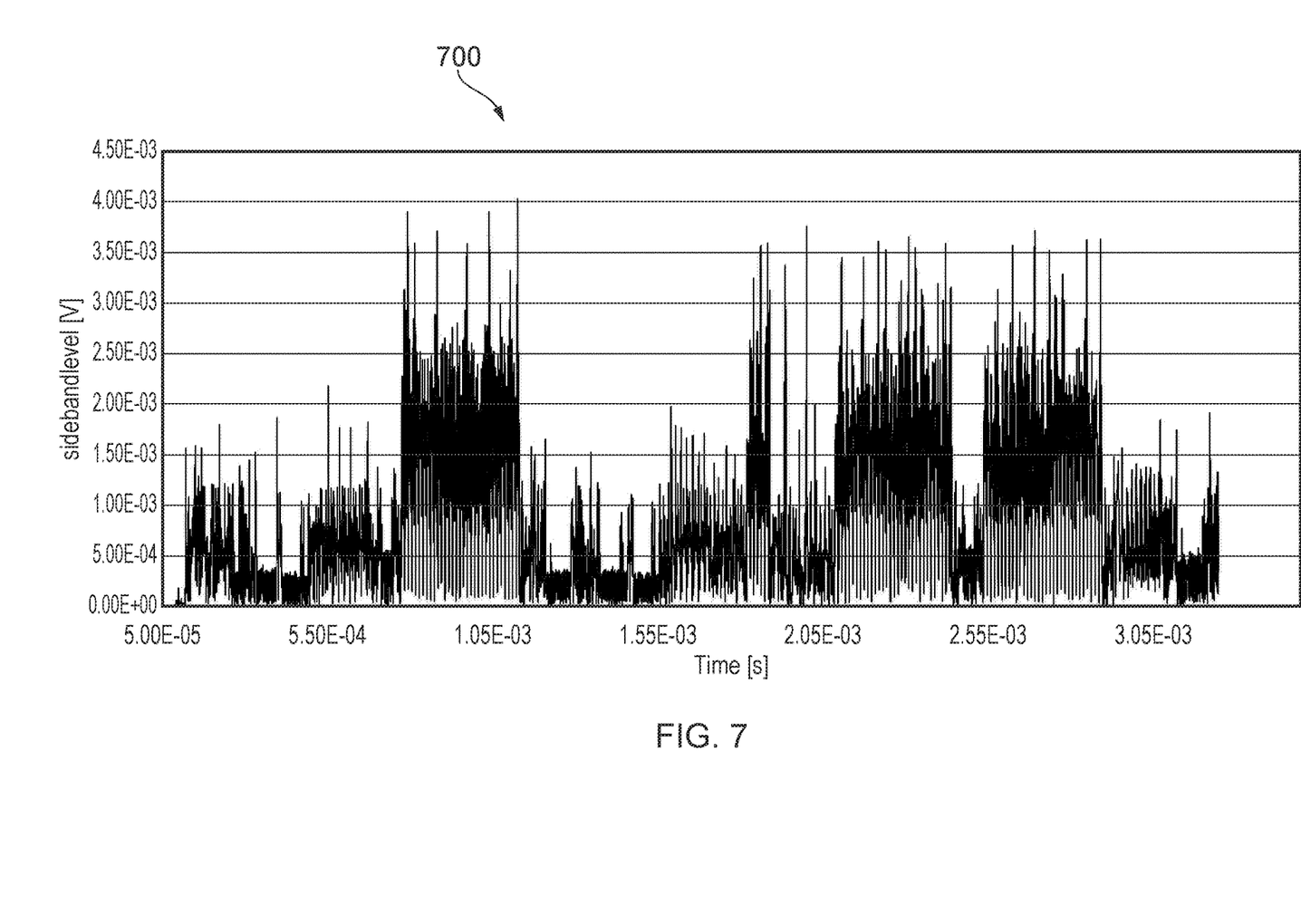
FIG. 7 shows a simulation result of a system in which the clock-stop frequency adjustment is not applied.
Figure 8:
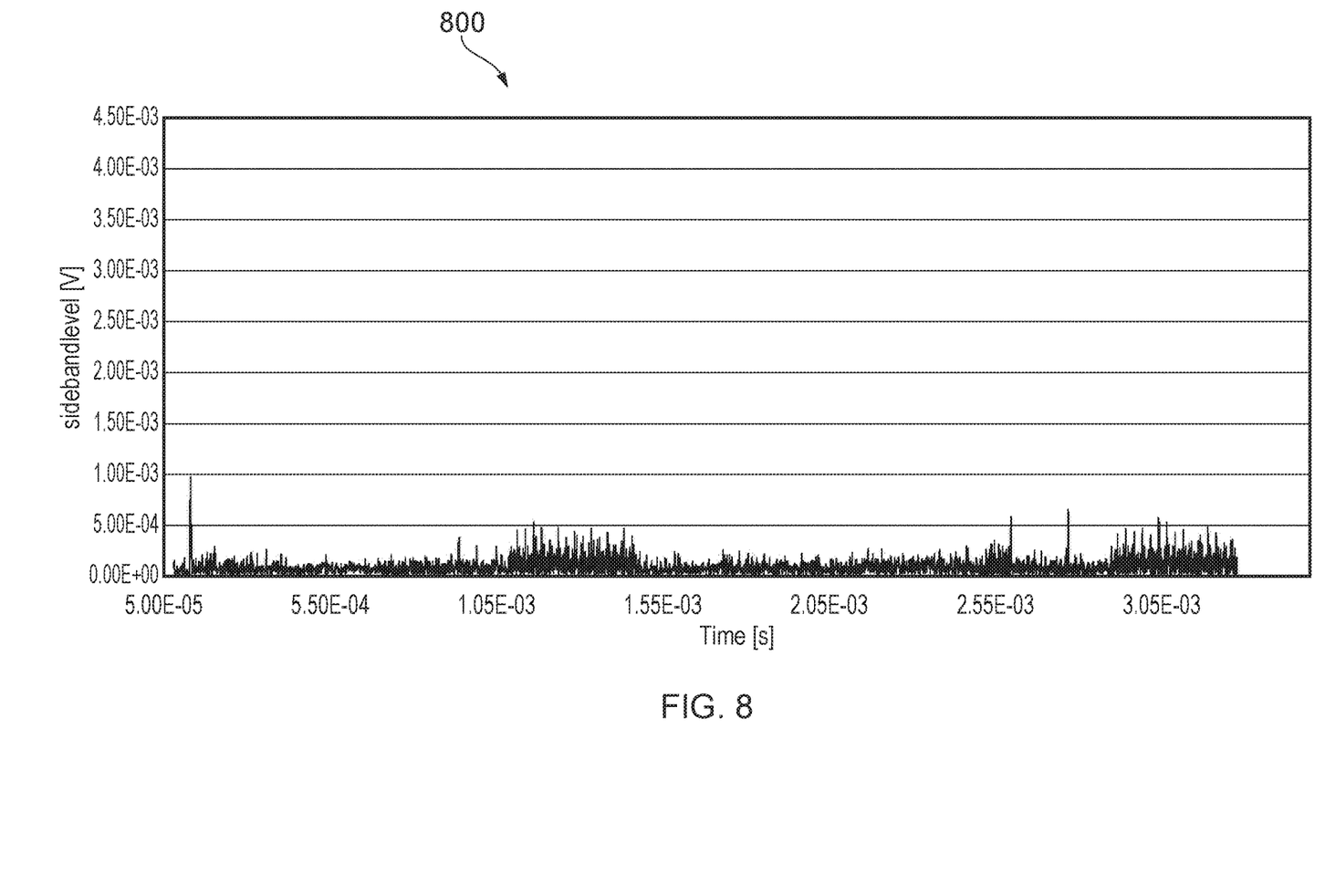
FIG. 8 shows a simulation result of a system in which the clock-stop frequency adjustment is applied.

FIGS. 7 and 8 illustrate an effect of the presently disclosed clock-stop frequency adjustment. In particular, FIG. 7 shows a simulation result 700 of a system in which the clock-stop frequency adjustment is not applied. It can be seen that the resulting EMD noise is high. In contrast, FIG. 8 shows a simulation result 800 of a system in which the presently disclosed clock-stop frequency adjustment is applied. It can be seen that the resulting EMD noise is significantly lower than in FIG. 7.

The systems and methods described herein may at least partially be embodied by a computer program or a plurality of computer programs, which may exist in a variety of forms both active and inactive in a single computer system or across multiple computer systems. For example, they may exist as software program(s) comprised of program instructions in source code, object code, executable code or other formats for performing some of the steps. Any of the above may be embodied on a computer-readable medium, which may include storage devices and signals, in compressed or uncompressed form.

As used herein, the term "computer" refers to any electronic device comprising a processor, such as a general-purpose central processing unit (CPU), a specific-purpose processor or a microcontroller. A computer is capable of receiving data (an input), of performing a sequence of predetermined operations thereupon, and of producing thereby a result in the form of information or signals (an output). Depending on the context, the term "computer" will mean either a processor in particular or more generally a processor in association with an assemblage of interrelated elements contained within a single case or housing.

The term "processor" or "processing unit" refers to a data processing circuit that may be a microprocessor, a co-processor, a microcontroller, a microcomputer, a central processing unit, a field programmable gate array (FPGA), a programmable logic circuit, and/or any circuit that manipulates signals (analog or digital) based on operational instructions that are stored in a memory. The term "memory" refers to a storage circuit or multiple storage circuits such as read-only memory, random access memory, volatile memory, non-volatile memory, static memory, dynamic memory, Flash memory, cache memory, and/or any circuit that stores digital information.

As used herein, a "computer-readable medium" or "storage medium" may be any means that can contain, store, communicate, propagate, or transport a computer program for use by or in connection with the instruction execution system, apparatus, or device. The computer-readable medium may be, for example but not limited to, an electronic, magnetic, optical, electromagnetic, infrared, or semiconductor system, apparatus, device, or propagation medium. More specific examples (non-exhaustive list) of the computer-readable medium may include the following: an electrical connection having one or more wires, a portable computer diskette, a random access memory (RAM), a read-only memory (ROM), an erasable programmable read-only memory (EPROM or Flash memory), an optical fiber, a portable compact disc read-only memory (CDROM), a digital versatile disc (DVD), a Blu-ray disc (BD), and a memory card.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Furthermore, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

LIST OF REFERENCE SIGNS 100 operation of clock-stop sensor
200 RFID transponder
202 clock-stop frequency detector
204 clock-stop frequency shifter
206 method of operating an RFID transponder
208 monitoring, by the frequency detector, an output frequency of a clock-stop sensor of the transponder
210 determining, by the frequency detector, if the output frequency falls within a response detection frequency range of an external reader
212 shifting, by the frequency shifter, the output frequency to a value outside the response detection frequency range
214 method of operating an RFID transponder
216 monitoring, by the frequency detector, an output frequency and output duty cycle of a clock-stop sensor of the transponder
218 determining, by the frequency detector, if the output frequency and output duty cycle fall within predefined response detection ranges
220 shifting, by the frequency shifter, the output frequency and duty cycle to values outside the predefined response detection ranges
300 clock-stop frequency adjustment system
302 clock-stop frequency detector
304 clock-stop frequency shifter
306 frequency detector
308 clock-stop ON duration detector
310 clock-stop pattern detector
312 artificial clock-stop generator
314 clock-stop frequency adjustment unit
316 non-volatile memory
318 synchronizer
400 EMD noise frequency detection
500 EMD noise with frequency shift
600 use of different programmable parameters
700 simulation result without clock-stop frequency adjustment
800 simulation result with clock-stop frequency adjustment

The invention claimed is:

1. A transponder, comprising:
   a frequency detector configured to monitor an output frequency of a clock-stop sensor of said transponder, wherein said frequency detector is further configured to determine if said output frequency falls within a response detection frequency range of an external reader; and
   a frequency shifter configured to shift, in response to the frequency detector determining that the output frequency falls within said response detection frequency range, said output frequency to a value outside said response detection frequency range.

2. The transponder of claim 1,
   wherein the frequency detector is further configured to monitor the duty cycle of the clock-stop sensor output, wherein the frequency detector is further configured to determine if said duty cycle falls within a response duty cycle range; and
   wherein the frequency shifter is further configured to change a logic high duration of the duty cycle in response to the frequency detector determining that the duty cycle falls within said response duty cycle range.

3. The transponder of claim 2, wherein the response detection frequency range and/or the response duty cycle range are programmable parameters.

4. The transponder of claim 3, further comprising a memory for storing said programmable parameters.

5. The transponder of claim 4, wherein said memory is a non-volatile memory.

6. The transponder of claim 2, wherein the frequency detector and the frequency shifter are configured to use different sets of programmable parameters for different sets of reader commands.

7. The transponder of claim 1, being a radio frequency identification, RFID, transponder.

8. The transponder of claim 7, being an RFID tag or an RFID card.

9. A method of operating a transponder, the method comprising:
   monitoring, by a frequency detector of said transponder, an output frequency of a clock-stop sensor of said transponder;
   determining, by said frequency detector, if said output frequency falls within a response detection frequency range of an external reader; and
   shifting, by a frequency shifter of said transponder, in response to the frequency detector determining that the output frequency falls within said response detection frequency range, said output frequency to a value outside said response detection frequency range.

10. The method of claim 9,
    wherein the frequency detector further monitors the duty cycle of the clock-stop sensor output;
    wherein the frequency detector further determines if said duty cycle falls within a response duty cycle range; and
    wherein the frequency shifter further changes a logic high duration of the duty cycle in response to the frequency detector determining that the duty cycle falls within said response duty cycle range.

11. The method of claim 10, wherein the response detection frequency range and/or the response duty cycle range are programmable parameters.

12. The method of claim 11, wherein said programmable parameters are stored in a memory of said transponder.

13. The method of claim 9, wherein the frequency detector and the frequency shifter use different sets of programmable parameters for different sets of reader commands.

14. The method of claim 9, wherein a computer program includes instructions stored in a non-transitory computer-readable medium that when executed by a processing unit carry out the method.

* * * * *